(12) United States Patent
Jo et al.

(10) Patent No.: US 9,390,805 B2
(45) Date of Patent: Jul. 12, 2016

(54) MEMORY SYSTEMS AND OPERATING METHODS OF MEMORY CONTROLLERS

(71) Applicant: Samsung Electronics Co., Ltd., Suwon-si, Gyeonggi-do (KR)

(72) Inventors: Sungkyu Jo, Hwaseong-si (KR); Jinyub Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 240 days.

(21) Appl. No.: 14/162,928

(22) Filed: Jan. 24, 2014

(65) Prior Publication Data

US 2014/0223085 A1 Aug. 7, 2014

(30) Foreign Application Priority Data

Feb. 4, 2013 (KR) ........................ 10-2013-0012517

(51) Int. Cl.
*G11C 16/22* (2006.01)
*G11C 16/10* (2006.01)
*G11C 16/30* (2006.01)

(52) U.S. Cl.
CPC ............. *G11C 16/225* (2013.01); *G11C 16/10* (2013.01); *G11C 16/30* (2013.01)

(58) Field of Classification Search
CPC .......... G11C 5/143; G11C 5/147; G06F 1/24; H02H 3/207
See application file for complete search history.

(56) References Cited

U.S. PATENT DOCUMENTS

| | | | | |
|---|---|---|---|---|
| 5,586,077 A | * | 12/1996 | Olivo | G11C 16/30 365/189.07 |
| 5,640,357 A | * | 6/1997 | Kakimi | G11C 5/141 365/222 |
| 6,711,701 B1 | * | 3/2004 | Roohparvar | G11C 16/225 711/103 |
| 7,038,933 B2 | | 5/2006 | Kang | |
| 7,187,600 B2 | | 3/2007 | Sibigtroth et al. | |
| 7,269,748 B2 | | 9/2007 | Shuto et al. | |
| 7,483,328 B2 | * | 1/2009 | Kim | G11C 7/02 365/189.07 |
| 7,567,098 B2 | * | 7/2009 | Frew | H02H 3/207 327/142 |
| 8,140,880 B2 | | 3/2012 | Kimura | |
| 2001/0043493 A1 | * | 11/2001 | Fujioka | G06F 1/3203 365/189.09 |
| 2006/0062070 A1 | * | 3/2006 | Sibigtroth | G11C 5/145 365/226 |
| 2008/0253191 A1 | * | 10/2008 | Kang | G11C 16/20 365/185.18 |
| 2011/0099325 A1 | | 4/2011 | Roh et al. | |
| 2012/0102310 A1 | * | 4/2012 | Shim | G11C 5/143 713/2 |
| 2012/0170380 A1 | * | 7/2012 | Kumazaki | G11C 16/10 365/185.25 |
| 2012/0311407 A1 | | 12/2012 | Lee et al. | |
| 2013/0301373 A1 | * | 11/2013 | Tam | G11C 5/143 365/228 |

FOREIGN PATENT DOCUMENTS

| | | |
|---|---|---|
| JP | 08-249244 | 9/1996 |
| JP | 2002-049536 | 2/2002 |
| JP | 2007-206775 | 8/2007 |
| JP | 2011-209823 | 10/2011 |
| JP | 2012-113587 | 6/2012 |

* cited by examiner

*Primary Examiner* — Ryan Bertram
(74) *Attorney, Agent, or Firm* — Myers Bigel & Sibley, P.A.

(57) ABSTRACT

A memory system is provided which includes a nonvolatile memory; and a controller configured to control the nonvolatile memory, wherein the controller comprises a voltage detector configured to detect a level of a power supply voltage; and wherein when a level of the power supply voltage is lower than a first threshold value, the controller issues a reset command to the nonvolatile memory and then performs a reset operation.

18 Claims, 14 Drawing Sheets

MEMORY SYSTEMS AND OPERATING METHODS OF MEMORY CONTROLLERS

CROSS-REFERENCE TO RELATED APPLICATIONS

A claim for priority under 35 U.S.C. §119 is made to Korean Patent Application No. 10-2013-0012517 filed Feb. 4, 2013, in the Korean Intellectual Property Office, the entire contents of which are hereby incorporated by reference.

BACKGROUND

The inventive concepts described herein relate to semiconductor memory devices, and more particularly, relate to memory systems and methods of operating memory controllers.

A semiconductor memory device is a memory device that may be fabricated using semiconductors such as silicon (Si), germanium (Ge), gallium arsenide (GaAs), indium phosphide (InP), and so on. Semiconductor memory devices are classified into volatile memory devices and nonvolatile memory devices.

Volatile memory devices may lose stored contents at power-off. Volatile memory devices may include a static RAM (SRAM), a dynamic RAM (DRAM), a synchronous DRAM (SDRAM), and the like. Nonvolatile memory devices may retain stored contents even at power-off and may include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on.

A semiconductor memory may experience sudden power-off (SPO). The SPO may be such a phenomenon that a power supplied to the semiconductor memory is blocked without warning due to power failure and/or separation of a power plug. The SPO may cause an abnormal operation of the semiconductor memory. Thus, preparing for the SPO may improve the reliability of the semiconductor memory.

SUMMARY

One aspect of embodiments of the inventive concept is directed to provide a memory system which comprises a nonvolatile memory; and a controller configured to control the nonvolatile memory, wherein the controller comprises a voltage detector configured to detect a level of a power supply voltage; and wherein when a level of the power supply voltage is lower than a first threshold value, the controller issues a reset command to the nonvolatile memory and then performs a reset operation.

In example embodiments, the nonvolatile memory includes a second voltage detector configured to detect a level of the power supply voltage; and wherein when a level of the power supply voltage is lower than a second threshold value, the nonvolatile memory performs a reset operation.

In example embodiments, the second threshold value is lower than the first threshold value.

In example embodiments, the controller further comprises a register configured to store the threshold value; and wherein the controller detects the second threshold value from the nonvolatile memory, adjusts the threshold value to be higher than the second threshold value, and stores the threshold value adjusted at the register.

In example embodiments, the nonvolatile memory further comprises a register configured to store the second threshold value; and wherein the controller stores a value lower than the threshold value at the register as the second threshold value.

In example embodiments, the controller further comprises a first register configured to store the threshold value and the nonvolatile memory further comprises a second register configured to store the second threshold value. The controller decides the first and second threshold values such that the second threshold value is lower than the first threshold value and stores the first and second threshold values thus decided at the first and second registers, respectively.

In example embodiments, the controller does not issue a write, read or erase command to the nonvolatile memory until the reset operation is performed and then the power supply voltage is recovered.

In example embodiments, the controller does not receive a write, read or erase command from an external device until the reset operation is performed and then the power supply voltage is recovered.

In example embodiments, the nonvolatile memory does not receive a write, read or erase command from the controller until the reset operation is performed in response to the reset command or lowering of the second threshold value and the power supply voltage is recovered.

In example embodiments, the nonvolatile memory and the controller constitute a memory card.

In example embodiments, the nonvolatile memory and the controller constitute a solid state drive (SSD).

Another aspect of embodiments of the inventive concept is directed to provide an operating method of a memory controller which is configured to control a nonvolatile memory. The operating method comprises monitoring a power supply voltage; and if the power supply voltage is lower than a first threshold value, issuing a reset command to the nonvolatile memory and then performing a reset operation.

In example embodiments, the operating method further comprises detecting a second threshold value for a reset operation of the nonvolatile memory device from the nonvolatile memory; and adjusting the first threshold value or the second threshold value such that the first threshold value is higher than the second threshold value.

In example embodiments, the adjusting the first threshold value or the second threshold value comprises storing the second threshold value thus decided at the nonvolatile memory.

In example embodiments, the adjusting the first threshold value or the second threshold value comprises deciding the first threshold value to be higher than the second threshold value; and storing the first threshold value thus decided.

Some embodiments of the present inventive concept are directed to memory devices. Some embodiments of memory devices herein may include a nonvolatile memory and a controller that is configured to control the nonvolatile memory, to detect a power supply voltage level of a power supply voltage, to generate a reset command responsive to the power supply voltage level being lower than a first threshold value, and to perform a reset operation after generating the resent command.

Some embodiments provide that the nonvolatile memory is configured to detect the power supply voltage level and to perform a reset operation responsive to the power supply voltage being lower than a second threshold value that is lower than the first threshold value.

In some embodiments, the controller includes a voltage detector that is configured to detect the power supply voltage level and a register that is configured to store the first threshold value. The controller may be configured to detect the second threshold value from the nonvolatile memory, to adjust the first threshold value to be higher than the second threshold value, and to store the first threshold value adjusted at the register.

In some embodiments, the nonvolatile memory includes a second voltage detector that is configured to detect the power supply voltage level and a register that is configured to store the second threshold value. The controller may store the second threshold value at the register as a value that is lower than the first threshold value.

Some embodiments provide that the controller includes a first register that is configured to store the first threshold value and that the nonvolatile memory includes a second register that is configured to store the second threshold value. The controller may be configured to determine the first and second threshold values such that the second threshold value is lower than the first threshold value and to store the first and second threshold values at the first and second registers, respectively.

In some embodiments, the controller is configured to issue a write, read and/or erase command to the nonvolatile memory after the reset operation is performed and the power supply voltage is recovered.

Some embodiments provide that the nonvolatile memory is configured to receive a write, read and/or erase command from the controller after the reset operation is performed in response to the reset command.

In some embodiments, the nonvolatile memory is configured to receive a write, read and/or erase command from the controller after the second threshold value is lowered and the power supply voltage is recovered.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE FIGURES

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION

Figure 1:
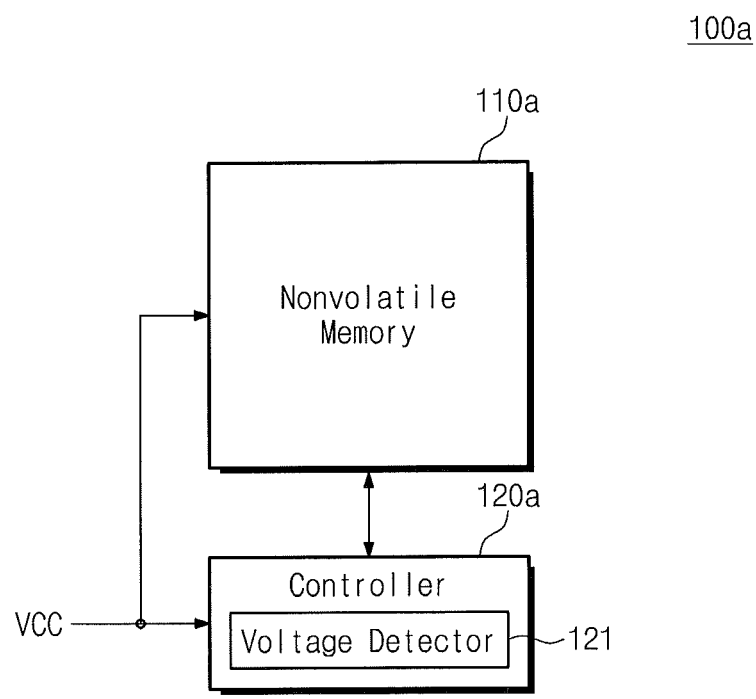
FIG. 1 is a block diagram schematically illustrating a memory system 100a according to some embodiments of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Reference numerals are indicated in detail in some embodiments of the present inventive concept, and their examples are represented in reference drawings. Throughout the drawings, like reference numerals are used for referring to the same or similar elements in the description and drawings.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system 100a according to some embodiments of the inventive concept. Referring to FIG. 1, a memory system 100a may include a nonvolatile memory 110a and a controller 120a.

The nonvolatile memory 110a may be configured to operate according to a control of the controller 120a. The nonvolatile memory 110a may execute writing, reading and erasing according to a control of the controller 120a. The nonvolatile memory 110a may be supplied with a power supply voltage VCC from an external device. The nonvolatile memory 110a may be a flash memory, a PRAM, an MRAM, an RRAM, and/or a FRAM, among others.

The controller 120a may be configured to control the nonvolatile memory 110a. The controller 120a may control writing, reading and erasing of the nonvolatile memory 110a. The controller 120a may control the nonvolatile memory 110a according to a request of an external host and/or a predetermined schedule. The controller 120a may be supplied with a power supply voltage VCC from the external device.

The controller 120a may include a voltage detector 121. The voltage detector 121 may detect a level of the power supply voltage VCC. When a level of the power supply voltage VCC detected by the voltage detector 121 is lower than a threshold value, the controller 120a may reset the nonvolatile memory 110a.

In some embodiments, the nonvolatile memory 110a and the controller 120a may both be supplied with the power supply voltage VCC from the external device. However, the inventive concept is not limited thereto. For example, the nonvolatile memory 110a and the controller 120a may be supplied with different power supply voltages that may be provided by the external device.

Figure 2:
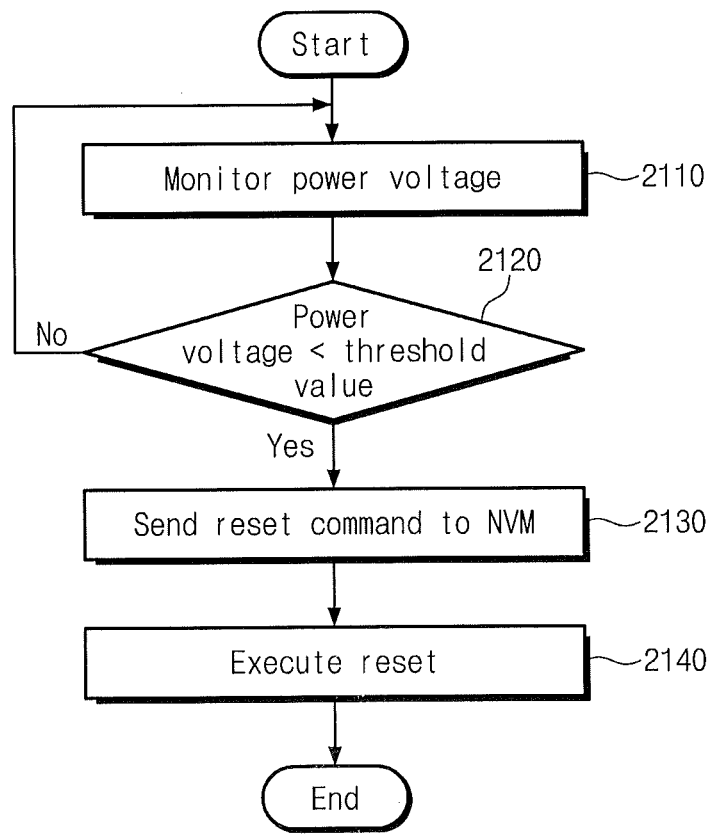
FIG. 2 is a flow chart schematically illustrating an operating method of a controller 120a of FIG. 1.

FIG. 2 is a flow chart schematically illustrating operating methods of a controller 120a of FIG. 1. In FIG. 2, there are illustrated methods where a controller 120a operates according to a level of a power supply voltage VCC.

Referring to FIGS. 1 and 2, in operation 2110, the power supply voltage VCC may be monitored. A voltage detector 121 may monitor a level of the power supply voltage VCC supplied from an external device.

In operation 2120, whether the power supply voltage VCC is lower than a threshold value may be determined. A controller 120a may compare a level of the power supply voltage VCC monitored by the voltage detector 121 with a predetermined threshold value. The threshold voltage may be decided by a ratio to a level of a normal power supply voltage VCC. For example, the threshold value may be set to a value corresponding to 90% of a level the normal power supply voltage VCC, corresponding to 70% of a level the normal power supply voltage VCC, and/or corresponding to 50% of a level the normal power supply voltage VCC, among others. For example, the threshold value may be set to a value lower by a predetermined voltage than a level of the normal power supply voltage VCC. Here, the predetermined voltage may be 0.3V, 0.1V, 0.05V, 0.03V, and/or 0.01V, among others. The threshold value may be set to a value higher than a level of a power supply voltage VCC that may result in an abnormal operation of the controller 120a. The threshold value may be set to a value higher than a level of a power supply voltage VCC that may result in an abnormal operation of the nonvolatile memory device 110a.

If the power supply voltage VCC is not lower than the threshold value, the methods may proceed to operation 2110 to continue to monitor the power supply voltage VCC. If the power supply voltage VCC is lower than the threshold value, the methods may proceed to operation 2130.

In operation 2130, a reset command may be sent to the nonvolatile memory device 110a. Some embodiments provide that the controller 120a may issue the reset command to the nonvolatile memory device 110a.

In operation 2140, a reset operation may be performed. In some embodiments, the controller 120a may perform a reset operation. The operation 2140 can be performed following the operation 2130.

With the above description, the controller 120a may monitor the power supply voltage VCC. If the power supply voltage VCC is lower than the threshold value, the controller 120a may send a reset command to the power supply voltage VCC, and may then perform its own reset operation.

If the power supply voltage VCC decreases due to sudden power-off ("SPO"), an operation of the nonvolatile memory device 110a may be abnormal. For example, the SPO may be generated when the nonvolatile memory device 110a executes a write operation. In this case, data written at the nonvolatile memory device 110a may be lost.

Some embodiments provide that the nonvolatile memory device 110a may be a multi-bit memory capable of storing two or more bits per memory cell. Data being written when the SPO is generated may be upper bit data additionally written in addition to previously written data. Both the upper bit data and the previously written data may be lost due to the SPO.

In some embodiments of the inventive concept, the controller 120a may detect a decrease in a power supply voltage VCC, and may perform a reset operation according to the detection result. Before performing the reset operation, the controller 120a may issue a reset command to the nonvolatile memory device 110a. In response to the reset command, the nonvolatile memory device 110a may stop a running operation (e.g., read, write, erase) and perform a reset recovery operation for a recovery of a previous state. Thus, the reliability of the controller 120a and the memory system 100a may be improved by preventing data from being lost due to the SPO.

Figure 3:
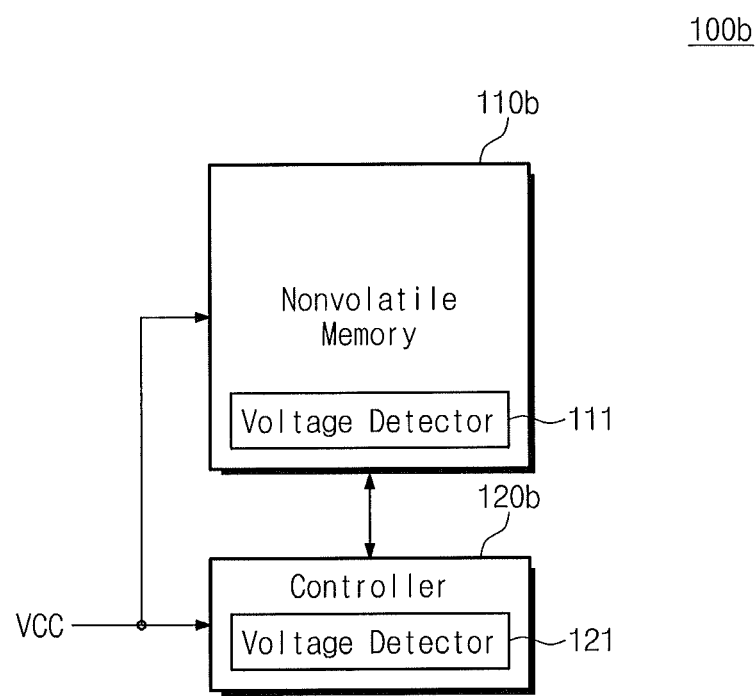
FIG. 3 is a block diagram schematically illustrating a memory system 100b according to some embodiments of the inventive concept.

FIG. 3 is a block diagram schematically illustrating a memory system 100b according to some embodiments of the inventive concept. Referring to FIG. 3, a memory system 100b may include a nonvolatile memory 110b and a controller 120b. A structure and an operation of the memory system 100b may be substantially the same as that of a memory system 100a described with reference to FIG. 1 except that the nonvolatile memory 110b includes a voltage detector 111. As such, a duplicative description is thus omitted.

The nonvolatile memory 110b may include a voltage detector 111. The voltage detector 111 may monitor a level of a power supply voltage VCC supplied from an external device. When a level of the power supply voltage VCC detected by the voltage detector 111 is lower than a second threshold value, the nonvolatile memory 110b may perform a reset operation.

Figure 4:
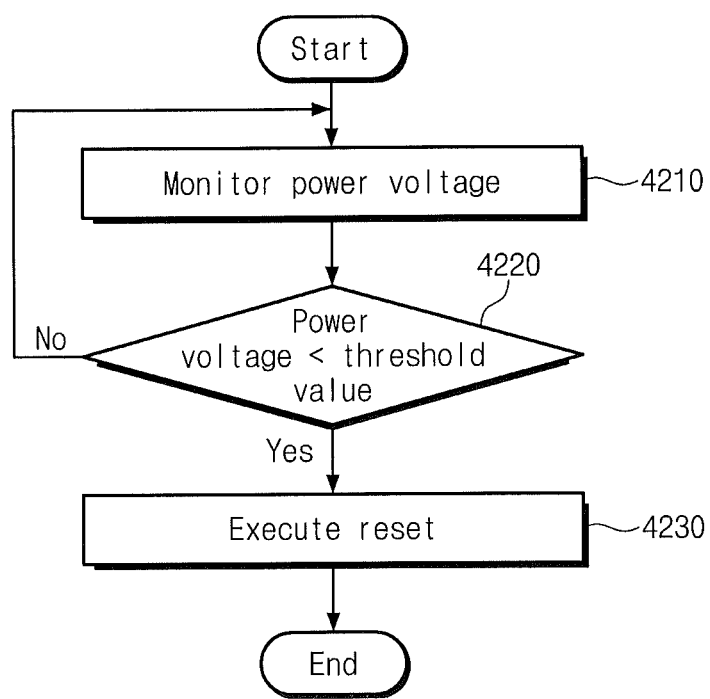
FIG. 4 is a flow chart schematically illustrating an operating method of a nonvolatile memory device 110b of FIG. 3.

FIG. 4 is a flow chart schematically illustrating operating methods of a nonvolatile memory device 110b of FIG. 3. In FIG. 4, there are illustrated methods where a nonvolatile memory device 110b operates according to a level of a power supply voltage VCC.

Referring to FIGS. 3 and 4, in operation 4210, the power supply voltage VCC may be monitored. A voltage detector 111 may monitor a level of the power supply voltage VCC supplied from an external device.

In operation 4220, whether the power supply voltage VCC is lower than a threshold value may be determined. A nonvolatile memory device 110b may compare a level of the power supply voltage VCC monitored by the voltage detector 111 with a predetermined second threshold value. The second threshold voltage may be decided by a ratio to a level of a normal power supply voltage VCC. For example, some embodiments provide that the threshold value may be set to a value corresponding to 90% of a level the normal power supply voltage VCC, corresponding to 70% of a level the normal power supply voltage VCC, and/or corresponding to 50% of a level the normal power supply voltage VCC, among others. In some embodiments, the second threshold value may be set to a value lower by a reference value than a level of the normal power supply voltage VCC. Here, the reference value may be 0.3V, 0.1V, 0.05V, 0.03V, and/or 0.01V, among others. The second threshold value may be set to a value higher than a level of a power supply voltage VCC that may result in an abnormal operation of the nonvolatile memory device 110b.

If the power supply voltage VCC is not lower than the second threshold value, the methods may proceed to operation 4210 to continue to monitor the power supply voltage VCC. If the power supply voltage VCC is lower than the threshold value, the methods may proceed to operation 4230.

In operation 4230, the nonvolatile memory device 110b may perform a reset operation.

In some embodiments of the inventive concept, the nonvolatile memory device 110b may perform a reset operation according to a level of the power supply voltage VCC and the controller 120b may perform a reset operation according to a level of the power supply voltage VCC. A first threshold value used to determine a reset operation of the controller 120b may be higher than a second threshold value used to determine a reset operation of the nonvolatile memory device 110b.

Figure 5:
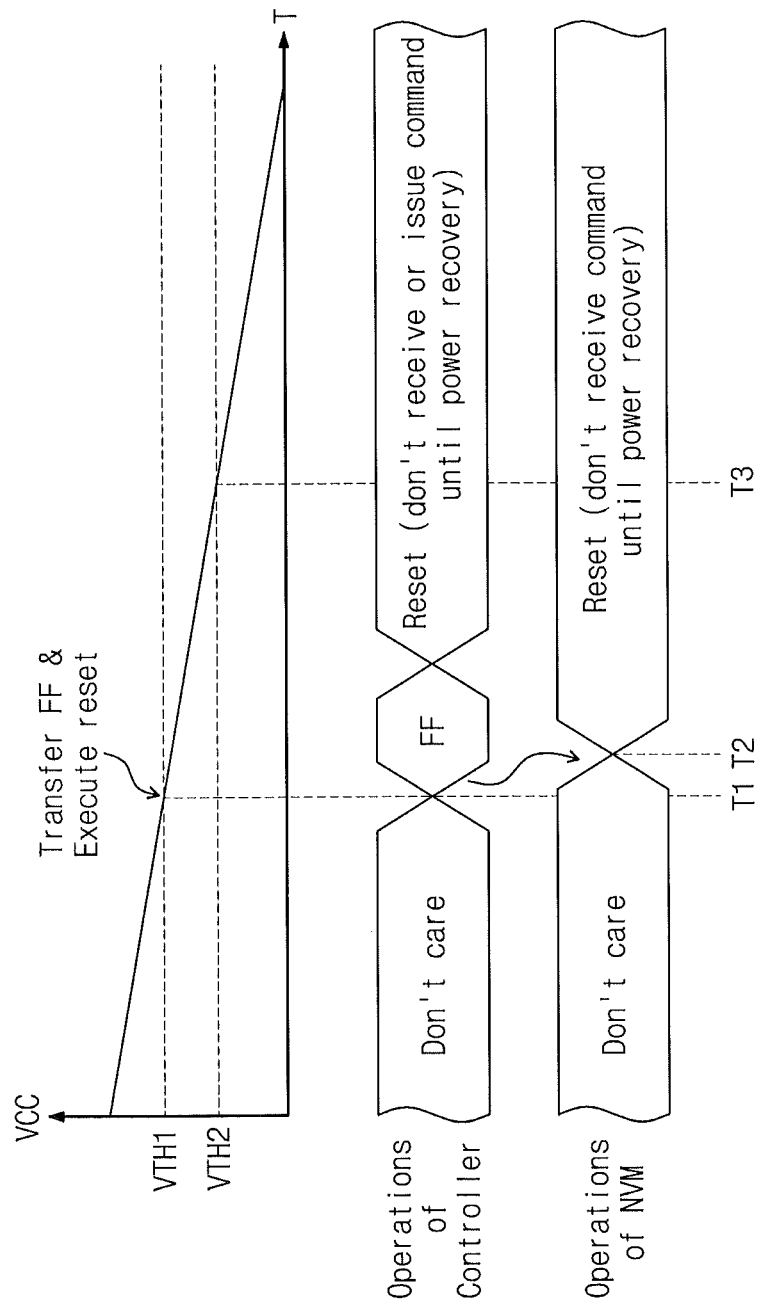
FIG. 5 is a diagram schematically illustrating an operation of a memory system 100b described with reference to FIG. 3.

FIG. 5 is a diagram schematically illustrating operations of a memory system 100b described with reference to FIG. 3. FIG. 5 illustrates an example in which a first threshold value used to determine a reset operation of a controller 120b may be higher than a second threshold value used to determine a reset operation of a nonvolatile memory device 110b.

Referring to FIGS. 3 and 5, at T1, a level of a power supply voltage VCC may become lower than a first threshold value VTH1. At T1, a controller 120b may issue a reset command FF to a nonvolatile memory 110b. Afterwards, the controller 120b may perform a reset operation. After and/or during the reset operation, the controller 120b may not receive a command from an external device. Also, the controller 120b may not issue a command to the nonvolatile memory 110b. The command input and output operations of the controller 120b may not be performed until the reset operation is performed and the power supply voltage VCC is recovered.

In response to the reset command FF transferred from the controller 120b, at T2, the nonvolatile memory 110b may perform a reset operation. After and/or while the reset operation is executed, the nonvolatile memory 110b may not receive a command from the controller 120b. The nonvolatile memory 110b may not receive a command from the controller 120b until the reset operation is performed and the power supply voltage VCC is recovered.

At T3, a level of the power supply voltage VCC may become lower than a second threshold value VTH2. At this time, the nonvolatile memory 110b may additionally perform a reset operation. Since a reset operation is previously performed, the nonvolatile memory 110b may not additionally perform a reset operation although a level of the power supply voltage VCC is lower than the second threshold value VTH2.

In some embodiments, the first threshold value VTH1 may be higher than the second threshold value VTH2. Thus, when a level of the power supply voltage VCC decreases due to the SPO, the nonvolatile memory 110b may be reset by the controller 120b before the nonvolatile memory 110b performs a reset operation itself, and the controller 120b may be reset.

Figure 6:
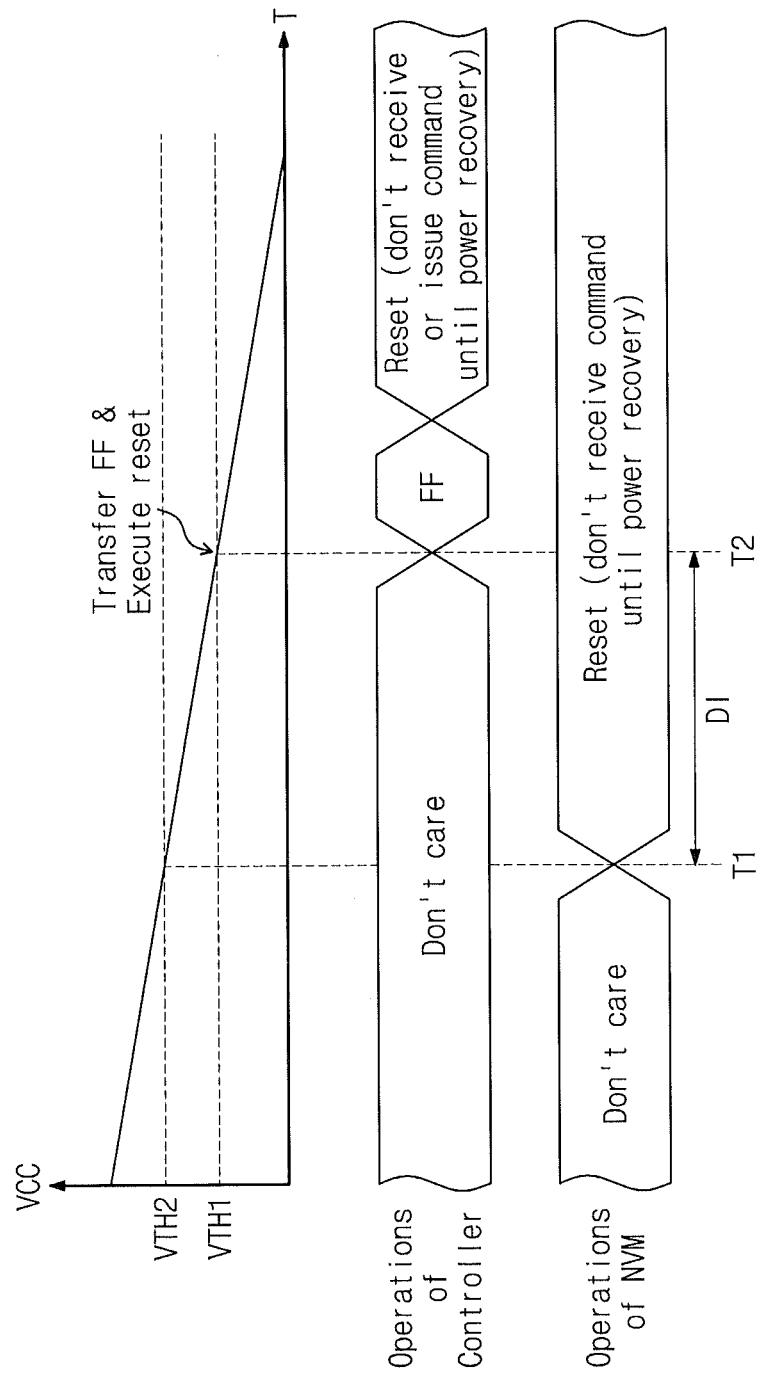
FIG. 6 is a diagram schematically illustrating another operation of a memory system 100b described with reference to FIG. 3.

FIG. 6 is a diagram schematically illustrating some operations of a memory system 100b described with reference to FIG. 3. In FIG. 6, there is illustrated an example where a first threshold value VTH1 used to determine a reset operation of a controller 120b may be lower than a second threshold value VTH2 used to determine a reset operation of a nonvolatile memory device 110b.

Referring to FIGS. 3 and 6, at T1, a level of a power supply voltage VCC may become lower than a second threshold value VTH2. At T1, a nonvolatile memory 110b may perform a reset operation. After and/or while the reset operation is executed, the nonvolatile memory 110b may not receive a command from a controller 120b. The nonvolatile memory 110b may not receive a command from a controller 120b until the reset operation is performed and the power supply voltage VCC is recovered.

At T2, a level of the power supply voltage VCC may become lower than a first threshold value VTH1. The controller 120b may issue a reset command FF to the nonvolatile memory 110b. Afterwards, the controller 120b may perform a reset operation. After and/or while the reset operation is executed, the controller 120b may not receive a command from an external device. Also, the controller 120b may not issue a command to the nonvolatile memory 110b.

In some embodiments, a disturbance interval DI may exist between T1 and T2. In the disturbance interval DI, the controller 120b may issue a command to the nonvolatile memory 110b, while the nonvolatile memory 110b may not receive a command from the controller 120b.

If the first threshold value VTH1 associated with the controller 120b is higher than the second threshold value VTH2 associated with the nonvolatile memory 110b, generation of the disturbance interval DI may be prevented. Thus, the reliability of the memory system 100b may be improved.

Figure 7:
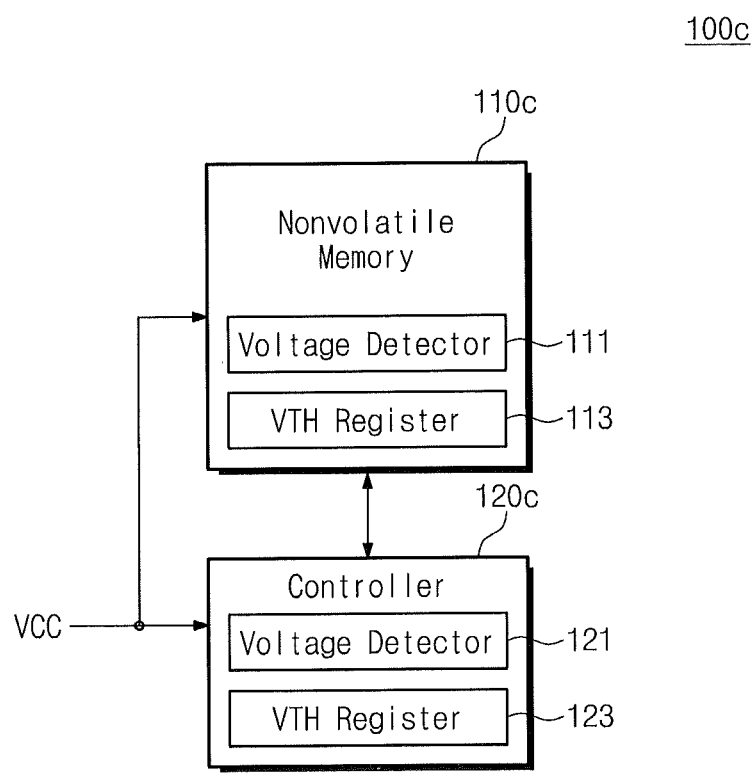
FIG. 7 is a block diagram schematically illustrating a memory system 100b according to some embodiments of the inventive concept.

FIG. 7 is a block diagram schematically illustrating a memory system 100b according to some embodiments of the inventive concept. Referring to FIG. 7, a memory system 100c may include a nonvolatile memory 110c and a controller 120c.

A structure and an operation of the memory system 100c may be substantially the same as that of a memory system 100b described with reference to FIG. 3 except that the controller 120c comprises a threshold value register 123 and the nonvolatile memory 110c comprises a threshold value register 113. As such, a duplicative description is thus omitted.

The nonvolatile memory 110c may include the threshold value register 113. The threshold value register 113 may store information associated with a level of a power supply voltage VCC at which the nonvolatile memory 110c performs a reset operation. The nonvolatile memory 110c may perform a reset operation when a level of the power supply voltage VCC monitored by a voltage detector 111 is lower than a threshold value stored at the threshold value register 113.

The controller 120c may include the threshold value register 123. The threshold value register 123 may store information associated with a level of a power supply voltage VCC where the controller 120c performs a reset operation. The controller 120c may issue a reset command to the nonvolatile memory 110c when a level of the power supply voltage VCC monitored by a voltage detector 121 is lower than a threshold value stored at the threshold value register 123, and then may perform a reset operation.

Figure 8:
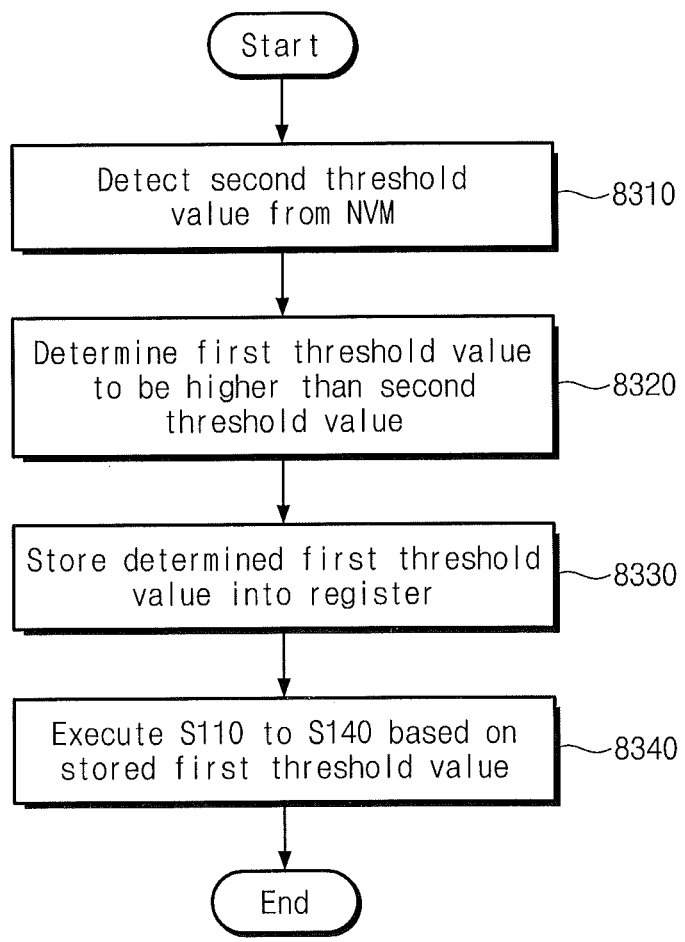
FIG. 8 is a flow chart schematically illustrating an operating method of a controller 120c of FIG. 7 according to some embodiments of the inventive concept.

FIG. 8 is a flow chart schematically illustrating operating methods of a controller 120c of FIG. 7 according to some embodiments of the inventive concept. Referring to FIGS. 7 and 8, in operation 8310, a controller 120c may detect a second threshold value from a nonvolatile memory 110c. For example, the controller 120c may detect the second threshold value stored at a threshold value register 113 of the nonvolatile memory 110c. The controller 120c may issue a command requesting the second threshold value to the nonvolatile memory 110c and receive information on the second threshold value from the nonvolatile memory 110c.

In operation 8320, the controller 120c may determine that the first threshold value is higher than the second threshold value.

In operation 8330, the controller 120c may store the first threshold value thus determined at a threshold value register 123.

If the operations 8310 to 8330 are performed, the second threshold value for a reset operation of the controller 120c may be set to be higher than the first threshold value for a reset operation of the nonvolatile memory 110c.

In operation 8340, as described with reference to operations 2110 to 2140 of FIG. 2, the controller 120c may monitor a power supply voltage VCC and perform its own reset operation and a reset operation of the nonvolatile memory device 110c according to the monitoring result.

In some embodiments, the controller 120c may determine the first threshold value to be higher by a predetermined reference value than the second threshold value. The controller 120c may decide the first threshold value to have a predetermined multiplying factor on the second threshold value.

The controller 120c may determine the first threshold value not to exceed a predetermined upper limit value. The predetermined upper limit value may be equal to or lower than a lower limit value of a power supply voltage range of the controller 120c defined by the specification of the controller 120c. The predetermined upper limit value may be higher than a level of the power supply voltage VCC that may result in an abnormal operation of the controller 120c. The controller 120c may determine the first threshold value to have a level between the upper limit value and the second threshold value.

The controller 120c may determine the first threshold value based on a predetermined table PDT. In some embodiments, the predetermined table PDT may include information on ranges of the second threshold value and first threshold values corresponding thereto. The controller 120c may detect the second threshold value, determine a range, which the second threshold value thus detected belongs to, from among the ranges of the predetermined table PDT, and determine a value corresponding to the range thus determined as the second threshold value.

Figure 9:
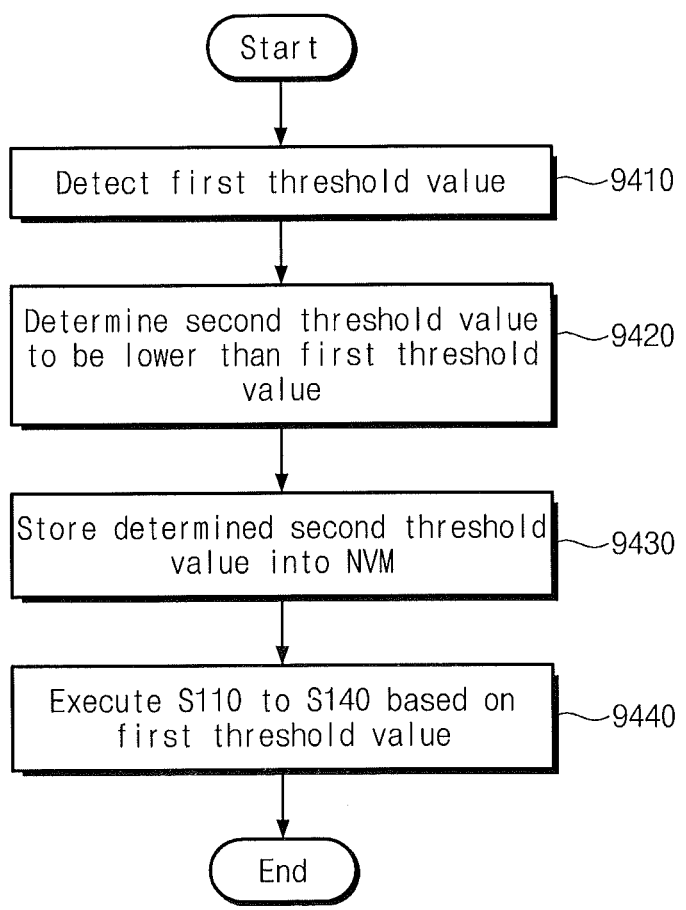
FIG. 9 is a flow chart schematically illustrating an operating method of a controller 120c of FIG. 7 according to some embodiments of the inventive concept.

FIG. 9 is a flow chart schematically illustrating operating methods of a controller 120c of FIG. 7 according to some embodiments of the inventive concept. Referring to FIGS. 7 and 9, in operation 9410, a controller 120c may detect a first threshold value. For example, the controller 120c may read the first threshold value stored at a threshold value register 123.

In operation 9420, the controller 120c may determine the second threshold value to be higher than the first threshold value.

In operation 9430, the controller 120c may store the second threshold value thus determined at a nonvolatile memory device 110c. For example, the controller 120c may store the second threshold value thus determined at a threshold value register 113 of the nonvolatile memory device 110c. The controller 120c may transfer the second threshold value and a command for storing the second threshold value to the nonvolatile memory device 110c.

If the operations 9410 to 9430 are performed, the second threshold value for a reset operation of the controller 120c may be set to be higher than the first threshold value for a reset operation of the nonvolatile memory 110c.

In operation 9440, as described with reference to operations 2110 to 2140 of FIG. 2, the controller 120c may monitor a power supply voltage VCC and perform its own reset operation and a reset operation of the nonvolatile memory device 110c according to the monitoring result.

In some embodiments, the controller 120c may determine the second threshold value to be higher by a predetermined reference value than the first threshold value. The controller 120c may decide the second threshold value to have a predetermined multiplying factor on the first threshold value.

The controller 120c may determine the second threshold value not to exceed a predetermined lower limit value. The predetermined lower limit value may be higher than a level of the power supply voltage VCC causing an abnormal operation of the controller 120c. The controller 120c may determine the second threshold value to have a level between the lower limit value and the first threshold value.

The controller 120c may determine the second threshold value based on a predetermined table PDT. In some embodiments, the predetermined table PDT may include information on ranges of the first threshold value and second threshold values corresponding thereto. The controller 120c may detect the first threshold value, determine a range, which the first threshold value thus detected belongs to, from among the ranges of the predetermined table PDT, and determine a value corresponding to the range thus determined as the second threshold value.

Figure 10:
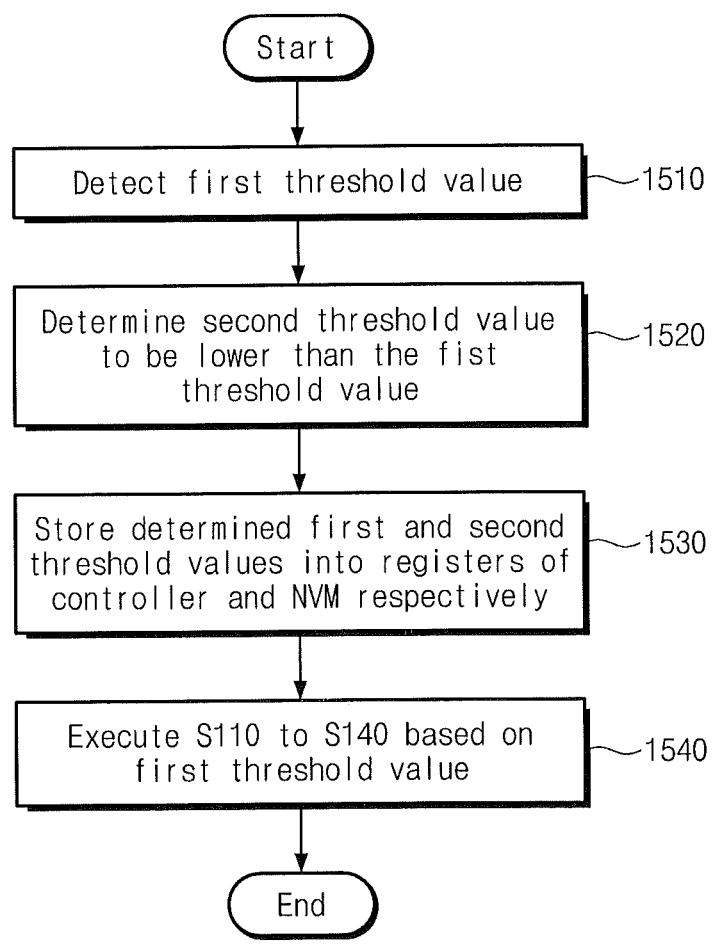
FIG. 10 is a flow chart schematically illustrating an operating method of a controller 120c of FIG. 7 according to still another embodiment of the inventive concept.

FIG. 10 is a flow chart schematically illustrating operating methods of a controller 120c of FIG. 7 according to some embodiments of the inventive concept. Referring to FIGS. 7 and 10, in operation 1510, a controller 120c may determine a first threshold value.

In operation 1520, the controller 120c may determine a second threshold value to be higher than the first threshold value.

In operation 1530, the controller 120c may store the first threshold value at a threshold value register 123 and the second threshold value at a threshold value register 113 of a nonvolatile memory 110c.

If the operations 1510 to 1530 are performed, the second threshold value for a reset operation of the controller 120c may be set to be higher than the first threshold value for a reset operation of the nonvolatile memory 110c.

In operation 1540, as described with reference to operations 2110 to 2140 of FIG. 2, the controller 120c may monitor a power supply voltage VCC and perform its own reset operation and a reset operation of the nonvolatile memory device 110c according to the monitoring result.

In some embodiments, the controller 120c may determine the first and second threshold values such that the first threshold value is higher by a predetermined reference value than the second threshold value. The controller 120c may determine the first and second threshold values such that the second threshold value has a predetermined multiplying factor on the first threshold value.

The controller 120c may determine the first threshold value not to exceed a predetermined upper limit value. The predetermined upper limit value may be equal to or lower than a lower limit value of a power supply voltage range of the controller 120c defined by the specification of the controller 120c. The predetermined upper limit value may be higher than a level of the power supply voltage VCC causing an abnormal operation of the controller 120c. The controller 120c may determine the first threshold value to have a level between the upper limit value and the second threshold value.

The controller 120c may determine the second threshold value not to exceed a predetermined lower limit value. The predetermined lower limit value may be higher than a level of the power supply voltage VCC causing an abnormal operation of the controller 120c.

The controller 120c may determine the first and second threshold values based on a predetermined table PDT. In some embodiments, the predetermined table PDT may include information on first threshold values and second threshold values corresponding thereto. The controller 120c may detect the first and second threshold values according to the predetermined table PDT.

As described with reference to FIGS. 8 to 10, the controller 120c may determine the second threshold value for a reset operation of the nonvolatile memory 110c or the first threshold value for a reset operation of the controller 120c. The first threshold value may be set to be higher than the second threshold value. Thus, the reliability of the memory system 100c may be improved.

In some embodiments, the threshold value registers 113 and 123 may retain data stored therein even at power-off. The threshold value registers 113 and 123 may be formed of a nonvolatile memory. The threshold value registers 113 and 123 may be formed of a fuse circuit.

Figure 11:
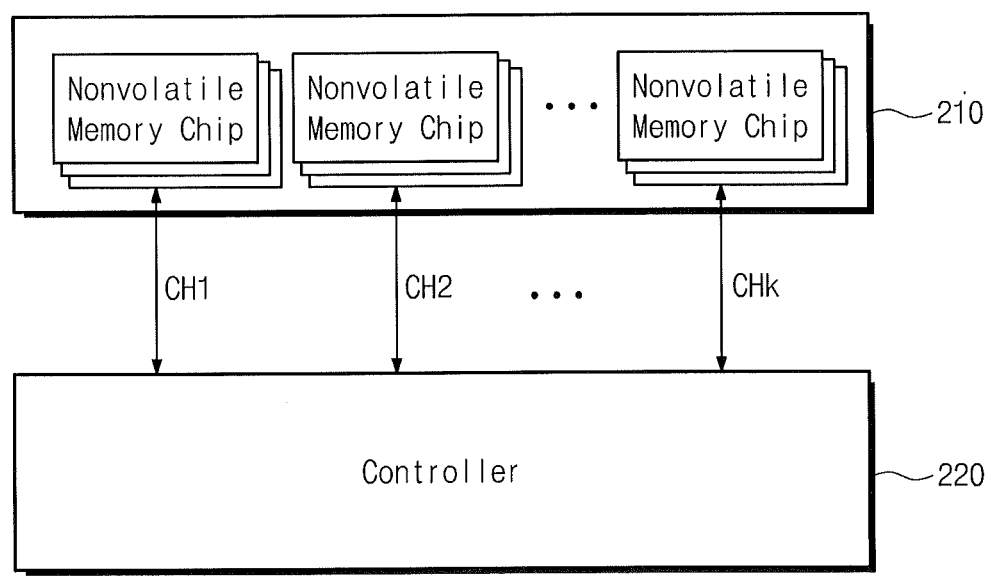
FIG. 11 is a block diagram schematically illustrating an application of a memory system 100a of FIG. 1.

FIG. 11 is a block diagram schematically illustrating an application of a memory system 100a of FIG. 1. Referring to FIG. 11, a memory system 200 may include a nonvolatile memory 210 and a controller 220. The nonvolatile memory 210 may include a plurality of nonvolatile memory chips. The nonvolatile memory chips may be divided into a plurality of groups. Nonvolatile memory chips in each group may be configured to communicate with the controller 220 via a common channel.

In FIG. 21, there is illustrated an example in which a plurality of nonvolatile memory chips communicates with the controller 220 via a plurality of channels CH1 to CHk. However, the inventive concept is not limited thereto. For example, the memory system 200 may be modified or changed such that a nonvolatile memory chip is connected to a channel.

As described with reference to FIGS. 1 to 10, the controller 220 may issue a reset command to the nonvolatile memory 210 according to a level of a power supply voltage and then perform its own reset operation. In the event that the nonvolatile memory 210 is configured to perform a reset operation according to a level of a power supply voltage, a first threshold value for a reset operation of the controller 220 may be set to be higher than a second threshold value for a reset operation of the nonvolatile memory 210.

Figure 12:
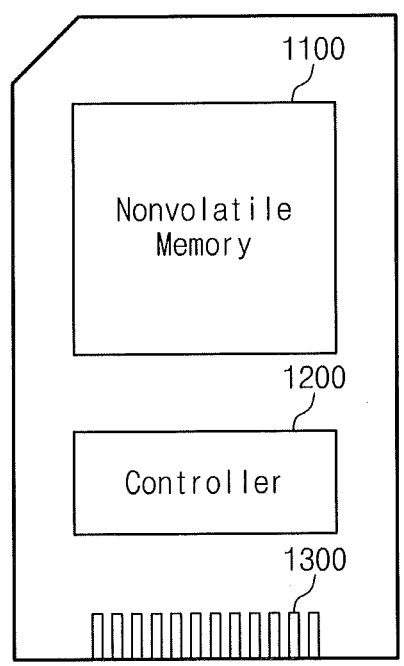
FIG. 12 is a block diagram schematically illustrating a memory card 1000 according to some embodiments of the inventive concept.

FIG. 12 is a block diagram schematically illustrating a memory card 1000 according to some embodiments of the inventive concept. Referring to FIG. 12, a memory card 1000 may include a nonvolatile memory 1100, a controller 1200, and a connector 1300.

The nonvolatile memory 1100 and/or the controller 1200 may perform a reset operation according to some embodiments of the inventive concept. The connector 1300 may electrically connect the memory card 1000 with an external device (e.g., a host).

The memory card 1000 may include memory cards such as a PC card (PCMCAI: personal computer memory card international association), a compact flash card (CF), a smart media card (SM, SMC), a memory stick, a multimedia card (MMC, RS-MMC, MMCmicro), an SD card (SD, miniSD, microSD, SDHC), and/or a universal flash storage device (UFS), among others.

Figure 13:
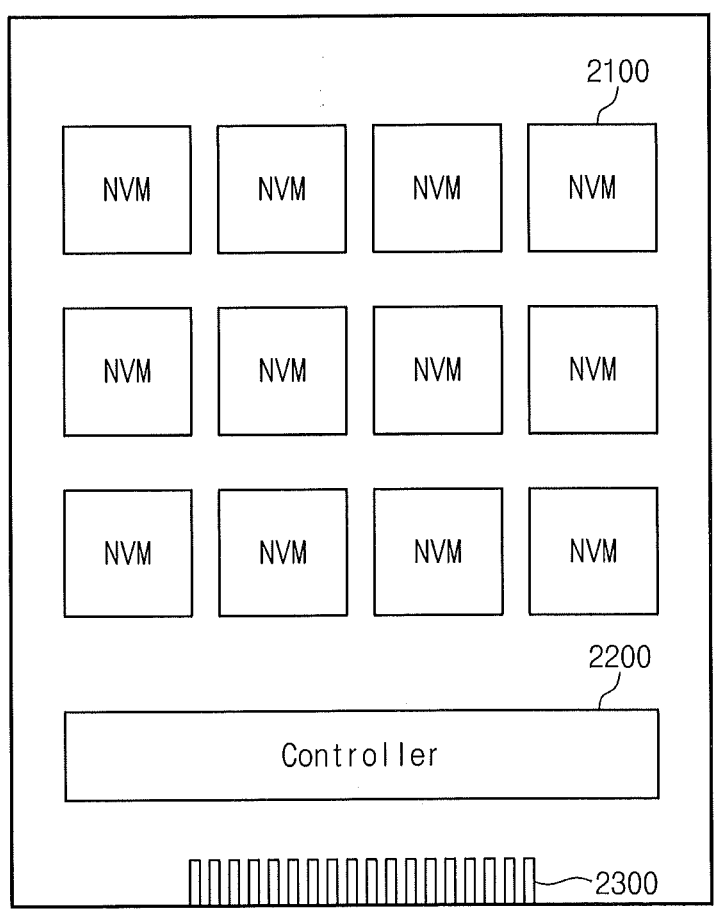
FIG. 13 is a block diagram schematically illustrating a solid state drive 2000 according to some embodiments of the inventive concept.

FIG. 13 is a block diagram schematically illustrating a solid state drive 2000 according to some embodiments of the inventive concept. Referring to FIG. 13, a solid state drive 2000 may include a plurality of nonvolatile memories 2100, a controller 2200, and a connector 2300.

The nonvolatile memories 2100 and/or the controller 2200 may perform a reset operation according to some embodiments of the inventive concept. The connector 2300 may electrically connect the solid state drive 2000 with an external device (e.g., a host).

Figure 14:
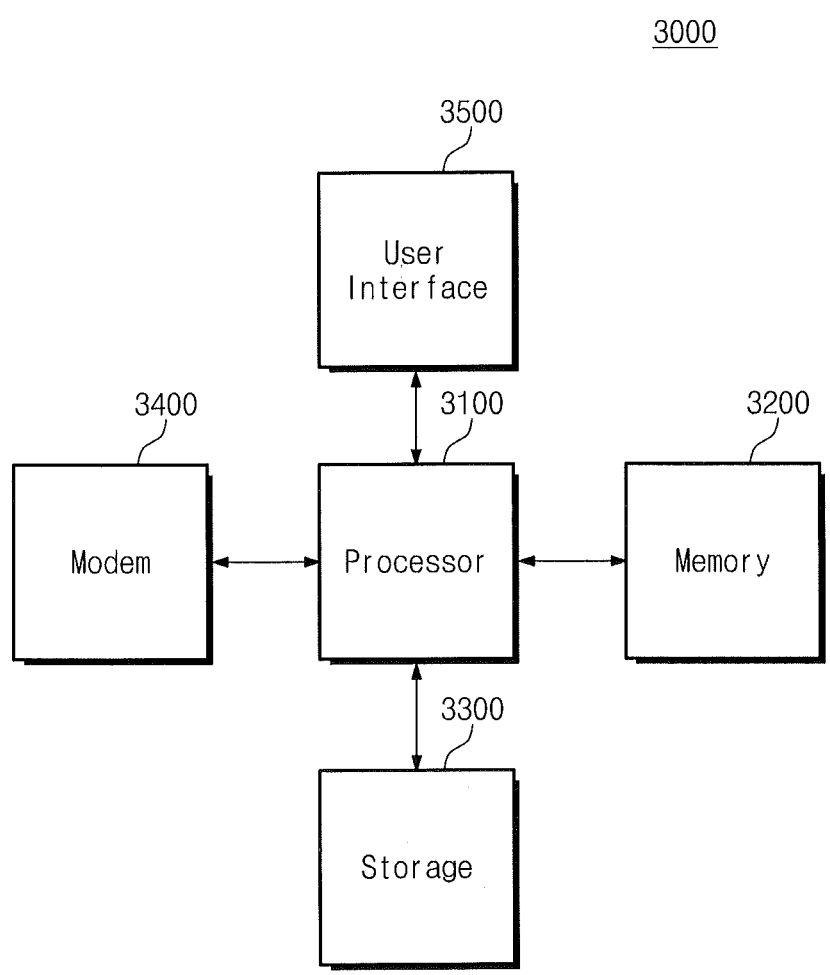
FIG. 14 is a block diagram schematically illustrating a computing device 3000 according to some embodiments of the inventive concept.

FIG. 14 is a block diagram schematically illustrating a computing device 3000 according to some embodiments of the inventive concept. Referring to FIG. 14, a computing device 3000 may include a processor 3100, a memory 3200, storage 3300, a modem 3400, and a user interface 3500.

The processor 3100 may control an overall operation of the computing device 3000, and may perform a logical operation. In some embodiments, the processor 3100 may be formed of a system-on-chip (SoC).

The memory 3200 may communicate with the processor 3100. The memory 3200 may be a working memory (or, main memory) of the processor 3100 and/or the computing device 3000. The memory 3200 may include a volatile memory such as a static RAM, a dynamic RAM, a synchronous DRAM, or the like or a nonvolatile memory such as a flash memory, a phase-change RAM (PRAM), a magnetic RAM (MRAM), a resistive RAM (RRAM), and/or a ferroelectric RAM (FRAM), among others.

The modem 3400 may communicate with an external device according to a control of the processor 3100. For example, the modem 3400 may communicate with the external device in a wired and/or wireless manner. The modem 3400 may communicate based on at least one of wireless communications manners such as LTE (Long Term Evolution), WiMax, GSM (Global System for Mobile communication), CDMA (Code Division Multiple Access), Bluetooth, NFC (Near Field Communication), WiFi, and/or RFID (Radio Frequency Identification), among others and/or wired communications manners such as USB (Universal Serial Bus), SATA (Serial AT Attachment), SCSI (Small Computer Small Interface), Firewire, and/or PCI (Peripheral Component Interconnection), among others.

The user interface 3500 may communicate with a user according to a control of the processor 3100. For example, the user interface 3500 may include user input interfaces such as a keyboard, a keypad, a button, a touch panel, a touch screen, a touch pad, a touch ball, a camera, a microphone, a gyroscope sensor, and/or a vibration sensor, among others. The user interface 3500 may further include user output interfaces such as an LCD, an OLED (Organic Light Emitting Diode) display device, an AMOLED (Active Matrix OLED) display device, an LED, a speaker, and/or a motor, among others.

The computing device 3000 may include one of memory systems 100a, 100b, and/or 100c according to some embodiments of the inventive concept. In some embodiments, a nonvolatile memory 110a, 110b and/or 110c and/or a controller 120a, 120b and/or 120c may constitute the storage 3300. In some embodiments, the nonvolatile memory 110a, 110b and/or 110c may be provided as the storage 3300, and the controller 120a, 120b and/or 120c may be provided in the processor 3100.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory system, comprising:
a nonvolatile memory; and
a controller configured to control the nonvolatile memory,
wherein the controller comprises a voltage detector configured to detect a level of a power supply voltage; and
wherein responsive to a level of the power supply voltage being lower than a first threshold value, the controller is configured to issue a reset command to the nonvolatile memory and then to perform a reset operation,
wherein the nonvolatile memory comprises a second voltage detector that is configured to detect a level of the power supply voltage, and
wherein the nonvolatile memory performs a reset operation responsive to the level of the power supply voltage being lower than a second threshold value, and
wherein the controller further comprises a register that is configured to store the first threshold value, and
wherein the controller is configured to detect the second threshold value from the nonvolatile memory, to adjust the first threshold value to be higher than the second threshold value, and to store the first threshold value adjusted at the register.

2. The memory system according to claim 1, wherein the second threshold value is lower than the first threshold value.

3. The memory system according to claim 1, wherein the nonvolatile memory further comprises a register that is configured to store the second threshold value, and
wherein the controller is configured to store a value lower than the first threshold value at the register as the second threshold value.

4. The memory system according to claim 1,
wherein the nonvolatile memory further comprises a second register that is configured to store the second threshold value, and
wherein the controller is configured to determine the first and second threshold values such that the second threshold value is lower than the first threshold value and to store the first and second threshold values at the first and second registers, respectively.

5. The memory system according to claim 1, wherein the controller does not issue a write, read or erase command to the nonvolatile memory until the reset operation is performed and then the power supply voltage is recovered.

6. The memory system according to claim 1, wherein the controller does not receive a write, read or erase command from an external device until the reset operation is performed and then the power supply voltage is recovered.

7. The memory system according to claim 1, wherein the nonvolatile memory does not receive a write, read or erase command from the controller until the reset operation is performed in response to the reset command or lowering of the second threshold value and the power supply voltage is recovered.

8. The memory system according to claim 1, wherein the nonvolatile memory and the controller constitute a memory card.

9. The memory system according to claim 1, wherein the nonvolatile memory and the controller constitute a solid state drive (SSD).

10. An operating method of a memory controller which is configured to control a nonvolatile memory, comprising:
monitoring a power supply voltage;
responsive to the power supply voltage being lower than a first threshold value, issuing a reset command to the nonvolatile memory and then performing a reset operation of the memory controller;
detecting a second threshold value for a reset operation of the nonvolatile memory device from the nonvolatile memory; and
adjusting the first threshold value or the second threshold value such that the first threshold value is higher than the second threshold value.

11. The operating method according to claim 10, wherein adjusting the first threshold value or the second threshold value comprises storing the second threshold value thus decided at the nonvolatile memory.

12. The operating method according to claim 10, wherein adjusting the first threshold value or the second threshold value comprises deciding the first threshold value to be higher than the second threshold value; and
storing the first threshold value thus decided.

13. A memory device, comprising:
a nonvolatile memory; and
a controller that is configured to control the nonvolatile memory, to detect a power supply voltage level of a power supply voltage, to generate a reset command responsive to the power supply voltage level being lower than a first threshold value, and to perform a reset operation after generating the reset command, wherein the nonvolatile memory is configured to detect the power supply voltage level and to perform a reset operation responsive to the power supply voltage being lower than a second threshold value that is lower than the first threshold value, and wherein the controller comprises:

a voltage detector that is configured to detect the power supply voltage level; and a register that is configured to store the first threshold value, wherein the controller is configured to detect the second threshold value from the nonvolatile memory, to adjust the first threshold value to be higher than the second threshold value, and to store the first threshold value adjusted at the register.

14. The memory device according to claim 13, wherein the nonvolatile memory comprises:

a second voltage detector that is configured to detect the power supply voltage level; and a register that is configured to store the second threshold value, wherein the controller stores the second threshold value at the register as a value that is lower than the first threshold value.

15. The memory device according to claim 13, wherein the nonvolatile memory comprises a second register that is configured to store the second threshold value, and wherein the controller is configured to determine the first and second threshold values such that the second threshold value is lower than the first threshold value and to store the first and second threshold values at the first and second registers, respectively.

16. The memory device according to claim 13, wherein the controller is configured to issue a write, read and/or erase command to the nonvolatile memory after the reset operation is performed and the power supply voltage is recovered.

17. The memory device according to claim 13, wherein the nonvolatile memory is configured to receive a write, read and/or erase command from the controller after the reset operation is performed in response to the reset command.

18. The memory device according to claim 13, wherein the nonvolatile memory is configured to receive a write, read and/or erase command from the controller after the second threshold value is lowered and the power supply voltage is recovered.

* * * * *